US006654406B1

United States Patent
Kim et al.

(10) Patent No.: US 6,654,406 B1
(45) Date of Patent: Nov. 25, 2003

(54) FREQUENCY HOPPING RECEIVER CAPABLE OF REAL-TIME DEMODULATION AND METHOD THEREOF

(75) Inventors: Jae-Hwan Kim, Yongin (KR); Byung-Il Hong, Yongin (KR)

(73) Assignee: Samsung Thomson-CFS Co., Ltd., Kumi (KR)

( * ) Notice: Subject to any disclaimer, the term of this patent is extended or adjusted under 35 U.S.C. 154(b) by 0 days.

(21) Appl. No.: 09/476,790

(22) Filed: Dec. 30, 1999

(30) Foreign Application Priority Data

Dec. 30, 1998 (KR) .............................. 98-60738

(51) Int. Cl.$^7$ .............................................. H04B 1/713
(52) U.S. Cl. ....................................... 375/137; 455/265
(58) Field of Search ........................ 375/130, 132–137; 455/260, 264, 265, 296

(56) References Cited

U.S. PATENT DOCUMENTS

| 4,479,226 A | | 10/1984 | Prabhu et al. |
| 5,734,707 A | * | 3/1998 | El-Wailly ............... 379/167.06 |
| 6,047,015 A | * | 4/2000 | Watanabe et al. ........... 375/132 |

FOREIGN PATENT DOCUMENTS

| GB | 9930018.8 | 7/2000 |
| WO | WO 83/03505 | 10/1993 |

OTHER PUBLICATIONS

"Search Report" dated on Jan. 31, 2000 issued by U.K. Patent Office.

* cited by examiner

Primary Examiner—Temesghen Ghebretinsae
Assistant Examiner—Kevin M Burd
(74) Attorney, Agent, or Firm—Robert E. Busnell, Esq.

(57) ABSTRACT

A frequency hopping receiver capable of real time demodulation, and a method thereof are provided. The frequency hopping receiver includes first and second frequency generators, a switch, a controller and a demodulator. The first frequency generator receives a first frequency control signal according to a predetermined control and generates a predetermined frequency first carrier wave used to generate a synthesized carrier wave for demodulating the received signal. The second frequency generator receives a second frequency control signal according to a predetermined control and generates a predetermined frequency second carrier wave used to generate the synthesized carrier wave for demodulating the received signal. The switch switches between the first and second carrier waves in response to a signal for selecting a carrier wave, to generate a continuous synthesized carrier wave. The controller generates the first and second frequency control signals for carrier generation and transmits the first and second frequency control signals to the first and second frequency generators, respectively, when the transmitted signal is received, generates a carrier selection signal for selecting either the first carrier wave generated by the first frequency generator or the second carrier wave generated by the second frequency generator, and generates a demodulation control signal for initiating demodulation when the synthesized carrier wave is generated by the switch. The demodulator receives the synthesized carrier wave from the switch and the demodulation control signal from the controller, and demodulates the received signal.

9 Claims, 3 Drawing Sheets

FREQUENCY HOPPING RECEIVER CAPABLE OF REAL-TIME DEMODULATION AND METHOD THEREOF

CLAIM OF PRIORITY

This application makes reference to, incorporates the same herein, and claims all benefits accruing under 35 U.S.C §119 from an application entitled Frequency Hopping Receiver Capable Of Real-time demodulation And Method Thereof earlier filed in the Korean Industrial Property Office on Dec. 30 1998, and there duly assigned Serial No. 98-60738 by that Office.

BACKGROUND OF THE INVENTION

1. Field of the Invention

The present invention relates to a frequency hopping system, and more particularly, to a frequency hopping receiver in which a received signal is processed in real time, and a method thereof.

2. Description of the Related Art

In communication systems, generally, the receiving side demodulates a modulated signal transmitted from the transmitting side to detect the original signal, whereby communications between the transmitting and receiving sides are performed. A frequency hopping system is used to secure these transmitted and received signals.

In the frequency hopping system, the transmitting side widens the bandwidth of a signal by irregularly changing the carrier frequency of a signal to be transmitted, in accordance with a hopping pattern with respect to time, thus transmitting a resultant signal. The receiving side receives a carrier frequency used upon modulation performed at the transmitting side, and demodulates a received signal in accordance with a hopping pattern which synchronizes with the received carrier frequency.

However, during the demodulation of a received signal at the receiving side, when the frequency of a received carrier wave is changed in accordance with a hopping pattern, some time, that is, a frequency transition time during which frequency is not stable, is required. If the receiving side demodulates a received signal during the frequency transition time, an error may be generated.

In order to solve this problem, the receiving side in a conventional frequency hopping system stores a signal received during the frequency transition time, in a storage module included therein. After the frequency transition time has passed, that is, after a changed frequency becomes stable, the receiving side demodulates the received signal using the stabilized carrier frequency.

However, in this case, signal demodulation is delayed for the frequency transition time for carrier generation, which prevents the receiving side from performing real time demodulation on a received signal.

SUMMARY OF THE INVENTION

To solve the above problem, it is an objective of the present invention to provide a frequency hopping receiver capable of demodulating a received signal in real time, and a method thereof.

Accordingly, to achieve the above objective, the present intention provides a frequency hopping receiver capable of real-time demodulation, the receiver including first and second frequency generators, a switch, a controller and a demodulator. The first frequency generator receives a first frequency control signal according to a predetermined control and generates a predetermined frequency first carrier wave used to generate a synthesized carrier wave for demodulating the received signal. The second frequency generator receives a second frequency control signal according to a predetermined control and generates a predetermined frequency second carrier wave used to generate the synthesized carrier wave for demodulating the received signal. The switch switches between the first and second carrier waves in response to a signal for selecting a carrier wave, to generate a continuous synthesized carrier wave. The controller generates the first and second frequency control signals for carrier generation and transmits the first and second frequency control signals to the first and second frequency generators, respectively, when the transmitted signal is received, generates a carrier selection signal for selecting either the first carrier wave generated by the first frequency generator or the second carrier wave generated by the second frequency generator, and generates a demodulation control signal for initiating demodulation when the synthesized carrier wave is generated by the switch. The demodulator receives the synthesized carrier wave from the switch and the demodulation control signal from the controller, and demodulates the received signal.

It is preferable that the frequency of the first carrier wave generated by the first frequency generator is different from the frequency of the second carrier wave generated by the second frequency generator.

To achieve the above objective, the present intention provides a frequency hopping receiving method capable of real-time demodulation, the method including the steps of: (a) generating first and second frequency control signals for carrier generation having predetermined frequencies, when the transmitted signal is received; (b) receiving the first and second frequency control signals and generating a first carrier wave having a first frequency and a second carrier wave having a second frequency, wherein the two first and second carrier waves are used to generate a synthesized carrier for demodulation of the received signal; (c) switching between the first and second carrier waves according to a predetermined method to generate a continuous synthesized carrier wave; and (d) demodulating the received signal using the synthesized carrier wave after the synthesized carrier is produced.

BRIEF DESCRIPTION OF THE DRAWINGS

The above objective and advantage of the present invention will become more apparent by describing in detail a preferred embodiment thereof with reference to the attached drawings in which.

DESCRIPTION OF THE PREFERRED EMBODIMENT

Only portions necessary to give understanding of the operation according to the present invention will now be described, and the other portions will not be described to prevent scattering of the subject of the present invention.

Figure 1:
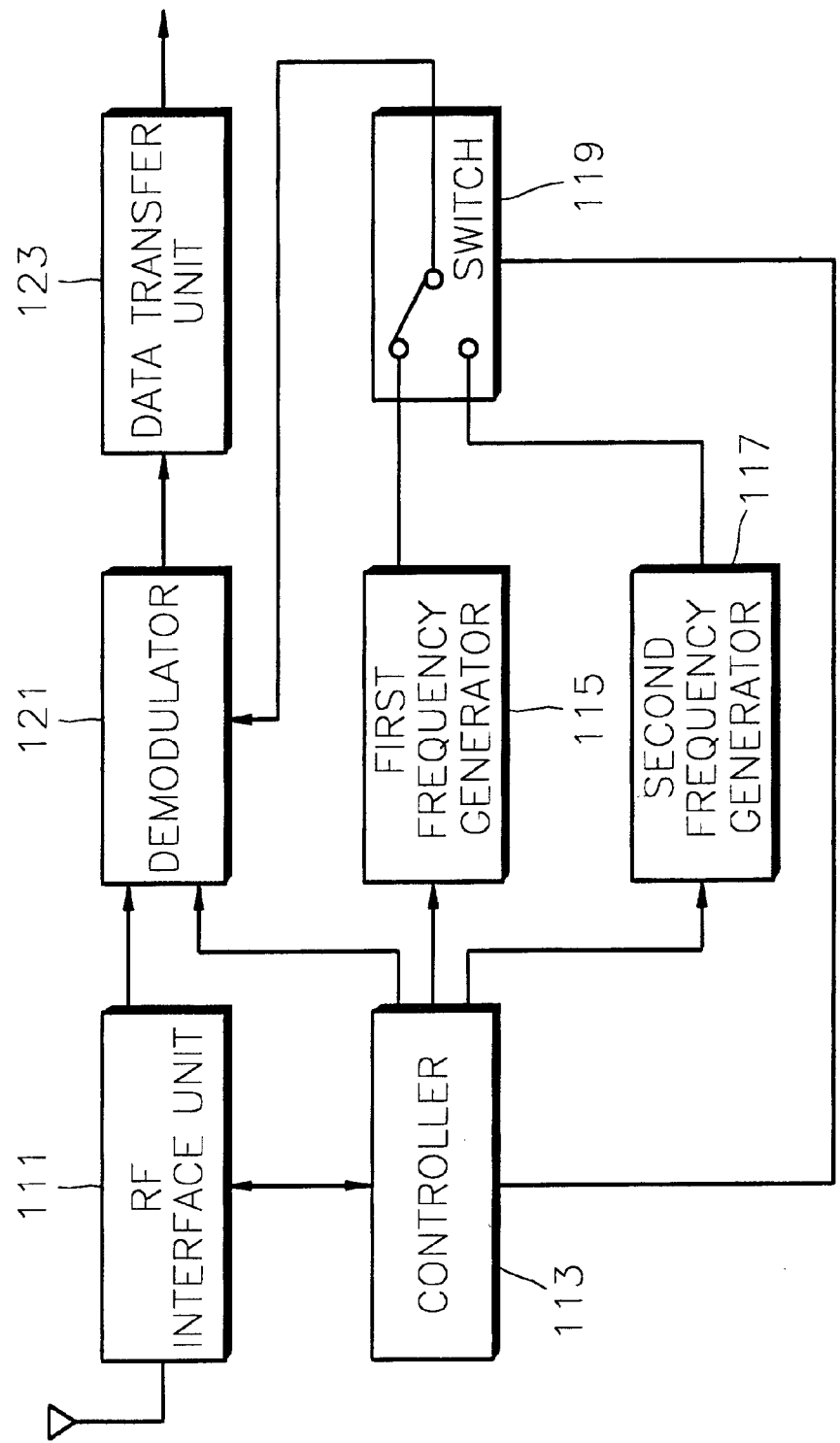
FIG. 1 is a block diagram illustrating the internal configuration of a frequency hopping receiver capable of real time demodulation, according to the present invention.

Referring to FIG. 1, a frequency hopping receiver according to the present invention includes an RF interface unit 111 for receiving a signal, a controller 113 for generating a control signal for carrier generation, a first frequency generator 115 for generating a first carrier wave, a second frequency generator 117 for generating a second carrier wave, a switch 119 for switching between the first and second carrier waves, a demodulator 121 for demodulating a received signal, and a data transfer unit 123 for transferring demodulated data.

When a signal is received from the transmitting side via the RF interface unit 111, the controller 113 detects the reception of the signal and transmits a first frequency control signal for carrier generation to the first frequency generator 115. The first frequency control signal includes the frequency data of the first carrier wave which is generated by the first frequency generator 115. After the controller 113 transmits the first frequency control signal to the first frequency generator 115, it transmits a second frequency control signal for carrier generation to the second frequency generator 117. The second frequency control signal includes the frequency data of the second carrier wave which is generated by the second frequency generator 117.

The first frequency generator 115 receives the first frequency control signal from the controller 113, and generates the first carrier wave corresponding to the frequency data included in the first frequency control signal.

The second frequency generator 117 receives the second frequency control signal from the controller 113, and generates the second carrier wave corresponding to the frequency data included in the second frequency control signal. Here, it is preferable that the first and second carrier waves are set to have different frequencies.

When the first carrier wave is generated by the first frequency generator 115, the controller 113 outputs a carrier selection signal to the switch 119. When the carrier selection signal generated by the controller 113 transitions to a logic high, the switch 119 selects the first carrier wave, and when the carrier selection signal transitions to a logic low, the switch 119 selects the second carrier wave. However, in another embodiment, the switch 119 may select the first carrier wave when the carrier selection signal transitions to a logic low, and select the second carrier wave when the carrier selection signal transitions to a logic high.

The switch 119 performs switching in response to the carrier selection signal generated by the controller 113. The first and second carrier waves are alternately selected according to the switching operation of the switch 119, resulting in a continuous carrier wave, that is, a synthesized carrier wave. Then, the synthesized carrier wave is transmitted to the demodulator 121. When the synthesized carrier wave generated by the switching of the switch 119 is output, the controller 113 outputs a demodulation control signal which is continuously in an enable state, to the demodulator 121.

The demodulator 121 receives the synthesized carrier wave and the demodulation control signal, demodulates a signal received via the RF interface unit 111, and outputs the demodulated signal to the data transfer unit 123. The data transfer unit 123 transfers data demodulated by the demodulator 121.

Figure 2:
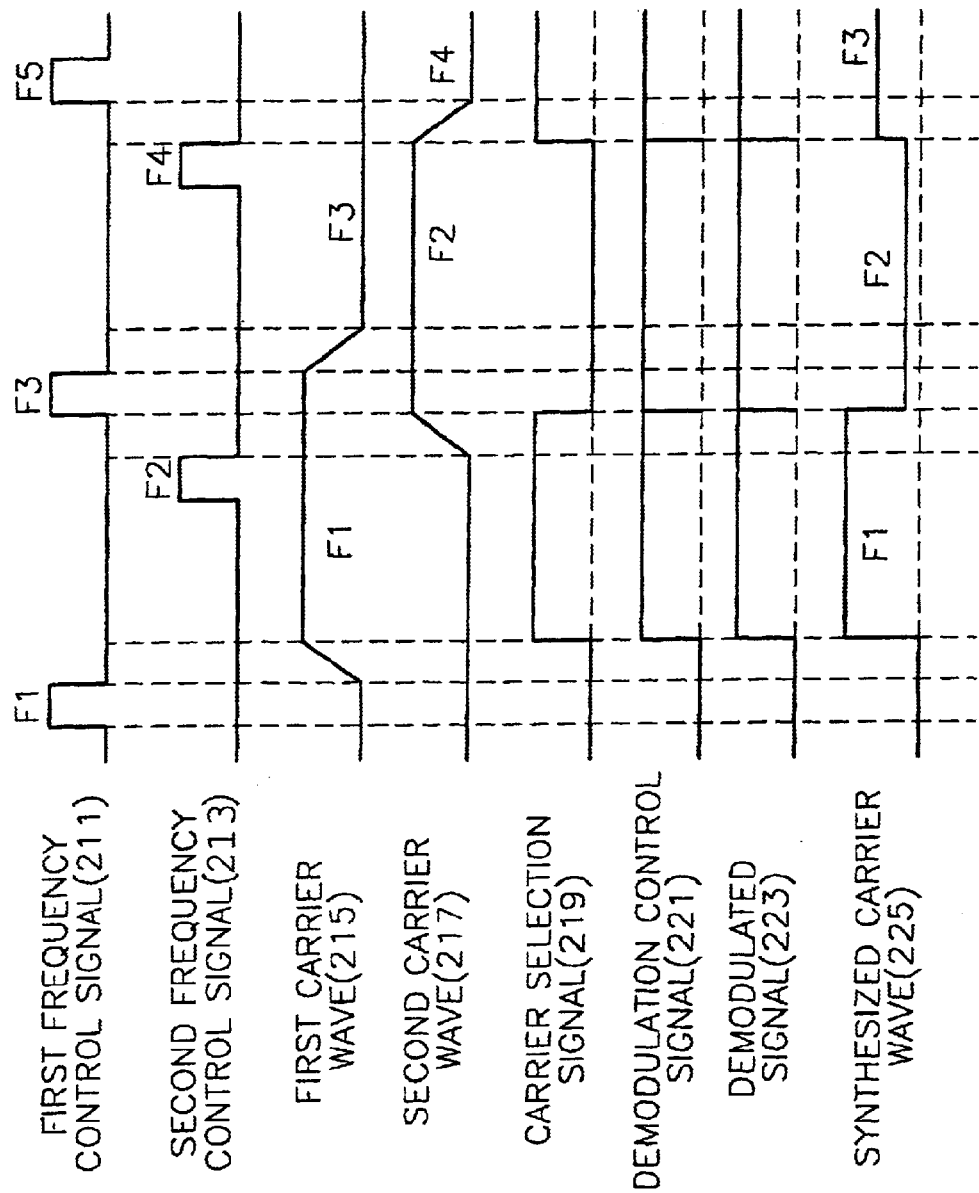
FIG. 2 is a timing diagram of real-time signal demodulation according to an embodiment of the present invention.

FIG. 2 is a timing diagram of real-time signal demodulation according to an embodiment of the present invention. The real-time signal demodulation process of a frequency hopping receiver according to a preferred embodiment of the present invention will now be described referring to FIGS. 1 and 2.

First, when a signal is received from the transmitting side via the RF interface unit 111, the controller 113 generates a first frequency control signal 211 and transmits the same to the first frequency generator 115. The first frequency control signal 211 is a pulse signal having frequency data of F1, F3, F5, . . . as shown in FIG. 2. Also, the controller 113 generates a second frequency control signal 213 and transmits the same to the second frequency generator 117. The second frequency control signal 213 is a pulse signal having frequency data of F2, F4, F6, . . . as shown in FIG. 2.

The first frequency generator 115 receives the first frequency control signal 211 and generates a first carrier wave 215 having a frequency which corresponds to frequency data F1, F3, F5, . . . included in the first frequency control signal 211. Also, the second frequency generator 117 receives the second frequency control signal 213 and generates a second carrier wave 217 having a frequency which corresponds to frequency data F2, F4, F6, . . . included in the second frequency control signal 213.

After the first and second carrier waves 215 and 217 are generated, the controller 113 generates a carrier selection signal 219 and transmits the same to the switch 119. The switch 119 receives the carrier selection signal 219 from the controller 113, and performs switching by selecting the frequency stable period of the first carrier wave 215, for example, the carrier frequency F1 thereof, when the carrier selection signal 219 is at logic high, and selecting the frequency stable period of the second carrier 217, for example, the carrier frequency F2 thereof, when the carrier selection signal 219 is at logic low. In this way, a synthesized carrier wave 225 having no frequency transition sections is generated and output to the demodulator 121.

At the same time, the controller 113 outputs a demodulation control signal 221 for starting demodulation of the received signal, to the demodulator 121. The demodulation control signal 221 is continuously at a logic high level.

The demodulator 121 receives the demodulation control signal 221 and the synthesized carrier wave 225, demodulates a signal received via the RF interface unit 111, and outputs a demodulated signal 223. The demodulated signal 223 is output to another device via the data transfer unit 123.

The demodulator 121 demodulates a modulated signal using the synthesized carrier wave 225 generated by the switch 119, thus producing the original signal. Hence, it is preferable that the switch 119 is designed so as to operate at a frequency that is the same as the frequency of the received signal.

Also, it is preferable that the demodulation control signal 221 generated by the controller 113 is continuously in an enable state as described above to continue demodulation in the demodulator 121 even after the synthesized carrier wave 225 is generated by the switch 119.

Figure 3:
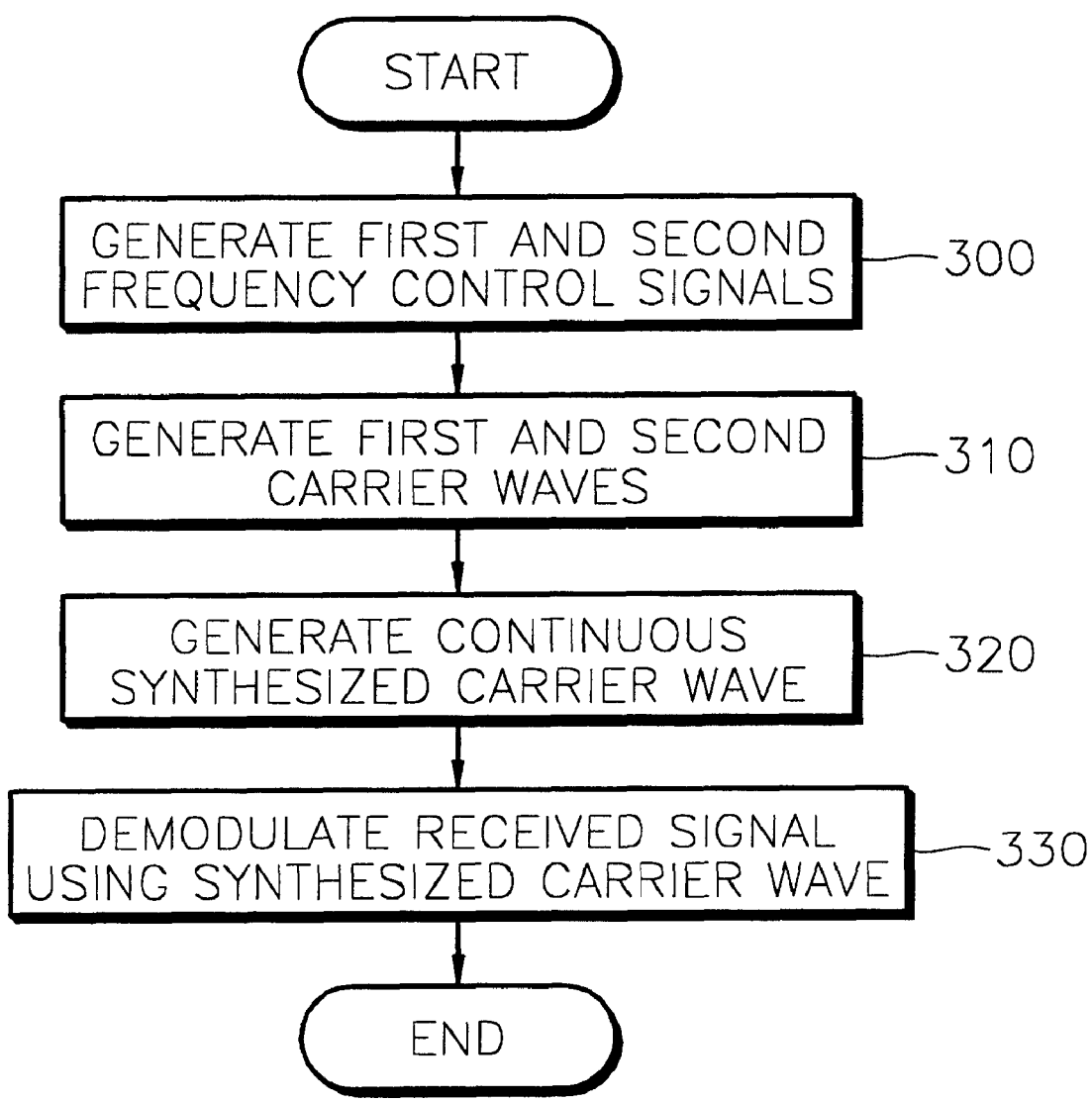
FIG. 3 is a flowchart illustrating a frequency hopping receiving method capable of real-time demodulation according to the present intention.

FIG. 3 is a flowchart illustrating a frequency hopping receiving method capable of real-time demodulation according to the present invention. Referring to FIG. 3, when a transmitted signal is received, first and second frequency control signals for carrier generation, each having a predetermined frequency, are generated, in step 300. The first and second frequency control signals are received, and first and second carriers having predetermined first and second frequencies, respectively, are generated to produce a synthesized carrier wave to be used for demodulating the received signal, in step 310. The first and second carrier waves are selected by a predetermined method, as described above, resulting in a continuous synthesized carrier wave, in step 320. After the synthesized carrier wave is produced, the received signal is demodulated using the synthesized carrier wave, in step 330.

The description of the above-mentioned steps in the frequency hopping receiving method are included in the description of the operation of the frequency hopping receiver, so will not be described in more detail.

In the frequency hopping receiver capable of real-time demodulation, and the frequency hopping receiving method as described above, when a signal is received, it is demodulated using a synthesized carrier wave obtained by synthesizing stabilized frequency periods, which prevents the frequency of the carrier from being delayed for a frequency transition period of time. Thus, it is possible to demodulate the received signal in real time.

Although the invention has been described with reference to a particular embodiment, it will be apparent to one of ordinary skill in the art that modifications of the described embodiment may be made without departing from the spirit and scope of the invention.

According to the present invention, first and second carrier waves having predetermined frequencies are generated, a synthesized carrier wave including stable frequency periods, i.e., not including a frequency transition period is generated by switching the first and second carrier waves by a predetermined method, and the frequency of a received signal is demodulated using the synthesized carrier wave. Therefore, delay caused during demodulation of a received signal is prevented, and real-time frequency demodulation can be achieved, consequently improving the performance of the frequency hopping system.

What is claimed is:

1. A frequency hopping receiver for receiving and demodulating, in real time, a modulated and transmitted signal, the receiver comprising:

a first frequency generator for receiving a first frequency control signal according to a first predetermined control, and generating a predetermined frequency first carrier wave used to generate a synthesized carrier wave for demodulating the received signal;

a second frequency generator for receiving a second frequency control signal according to a second predetermined control, and generating a predetermined frequency second carrier wave used to generate the synthesized carrier wave for demodulating the received signal;

a switch for switching between the first and second carrier waves in response to a carrier selection signal to produce a synthesized continuous carrier wave;

a controller for generating the first and second frequency control signals for carrier generation and transmitting the first and second frequency control signals to the first and second frequency generators, respectively, when the transmitted signal is received, generating said carrier selection signal for selecting one of the first carrier wave generated by the first frequency generator or the second carrier wave generated by the second frequency generator and then selecting the other of the first carrier wave generated by the first frequency generator or the second carrier wave generated by the second frequency generator, and generating a demodulation control signal for initiating demodulation when the synthesized continuous carrier wave is produced by the switch; and a demodulator for demodulating the received signal in response to the synthesized continuous carrier wave from the switch and the demodulation control signal from the controller.

2. The frequency hopping receiver of claim 1, wherein the frequency of the first carrier wave generated by the first frequency generator is different from the frequency of the second carrier wave generated by the second frequency generator.

3. The frequency hopping receiver of claim 1, wherein the switch is controlled by said carrier selection signal according to a frequency of the received signal.

4. The frequency hopping receiver of claim 1, wherein the demodulation control signal generated by the controller is continuously in an enable state.

5. A frequency hopping receiving method of receiving and demodulating, in real time, a modulated and transmitted signal, the method comprising the steps of:

generating first and second frequency control signals for controlling carrier generation, said first and second frequency control signals having predetermined frequencies, when the transmitted signal is received;

receiving the first and second frequency control signals and generating a first carrier wave having a first frequency and a second carrier wave having a second frequency, wherein the two first and second carrier waves are used to generate a continuous synthesized carrier wave for demodulation of the received signal;

switching between the first and second carrier waves to generate the continuous synthesized carrier wave; and demodulating the received signal using the synthesized carrier wave after the synthesized carrier is produced.

6. The method of claim 5, wherein the frequency of the first carrier wave generated in the receiving step is different from the frequency of the second carrier wave.

7. The method of claim 5, wherein the switching step comprises switching between the first and second carrier waves according to a frequency of the received signal.

8. The method of claim 5, further comprising a step of generating a switching control signal after generating said first and second carrier waves, said switching control signal being utilized in said switching step for switching between the first and second carrier waves according to a frequency of the received signal.

9. The method of claim 5, further comprising a step of generating a carrier switching control signal after generating said first and second carrier waves, said carrier switching control signal being generated according to a frequency of the received signal for controlling said switching step.

* * * * *